United States Patent
Karuishi

(10) Patent No.: US 7,190,590 B2
(45) Date of Patent: Mar. 13, 2007

(54) HOLDING FIXTURE, COMPONENT MOUNTING METHOD, ELECTRONIC CIRCUIT UNIT AND ELECTRONIC APPARATUS

(75) Inventor: Takeshi Karuishi, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 11/023,343

(22) Filed: Dec. 29, 2004

(65) Prior Publication Data

US 2006/0039119 A1    Feb. 23, 2006

(30) Foreign Application Priority Data

Aug. 18, 2004    (JP) .............................. 2004-238834

(51) Int. Cl.
    *H05K 7/20*    (2006.01)
(52) U.S. Cl. ........................................ 361/719; 439/73
(58) Field of Classification Search ................ 361/704, 361/707, 710, 719, 720; 439/73, 487
    See application file for complete search history.

(56) References Cited

U.S. PATENT DOCUMENTS

| | | | | |
|---|---|---|---|---|
| 6,195,880 B1 * | 3/2001 | Hinshaw et al. | ............... | 29/845 |
| 6,243,264 B1 * | 6/2001 | Bollesen et al. | ............ | 361/704 |
| 6,243,266 B1 * | 6/2001 | Lo | .............................. | 361/704 |
| 6,560,111 B1 * | 5/2003 | Lo | .............................. | 361/719 |
| 6,560,113 B1 * | 5/2003 | Ma | .............................. | 361/719 |
| 6,654,254 B2 * | 11/2003 | Szu et al. | ................... | 361/760 |
| 6,858,792 B2 * | 2/2005 | Franz et al. | ............... | 174/16.1 |

FOREIGN PATENT DOCUMENTS

JP    3083951    11/2001

* cited by examiner

*Primary Examiner*—Thanh-Tam Le
(74) *Attorney, Agent, or Firm*—Arent Fox PLLC

(57) ABSTRACT

A holding fixture that holds a component and mounts the component on an electronic circuit board includes a holding member that holds the component at a side of a first surface of the electronic circuit board, a first fixing member that includes a first base that is engageable with the holding member, and an elastic member that is pivotally attached to the base, sandwiches the electronic circuit board at a side of a second surface of the electronic circuit board, and elastically supports the holding member at the side of the first surface, the second surface opposing to the first surface, and a second fixing member that includes a second base that is engageable with the holding member, and a projection member that projects from the second surface of the electronic circuit board and is engageable with the elastic member.

9 Claims, 6 Drawing Sheets

PC GENERAL VIEW

HOLDING FIXTURE, COMPONENT MOUNTING METHOD, ELECTRONIC CIRCUIT UNIT AND ELECTRONIC APPARATUS

This application claims the right of foreign priority under 35 U.S.C. § 119 based on Japanese Patent Application No. 2004-238834 filed on Aug. 18, 2004, which is hereby incorporated by reference herein in its entirety as if fully set forth herein.

BACKGROUND OF THE INVENTION

The present invention relates generally to an electronic circuit unit and an electronic apparatus, and more particularly to a holding fixture that holds a component and mounts the component on a circuit substrate, an attachment method of the holding fixture to the electronic circuit board, etc. In this application, the component covers, but is not limited to, a heat sink that radiates a semiconductor device, such as a CPU, and a cooling fan that cools the same. The electronic circuit unit covers, but is not limited to, a motherboard and various extension boards. The electronic circuit unit covers, but is not limited to, the electronic circuit board mounted with the component. The electronic apparatus covers, but is not limited to, a laptop personal computer ("PC"), a personal digital assistant ("PDA"), a portable game machine, various drives, a display integrated type or slim type desktop PC, and a word processor.

The demands for electronic apparatuses typified by a PC have recently increased. In particular, along with remarkable developments and spreads of personal information apparatuses, such as a laptop PC and a PDA, these portable information apparatuses have been required to be smaller and lower-profile. In addition, as higher-performance and more multifunctional portable information apparatuses are demanded, various functions and units are installed in these apparatuses.

However, since the demands for miniaturization and low profile are not always compatible with the demands for high performance and multiple functions, the information apparatus would become larger as it possesses all the functions. In addition, since the high-performance and multiple functions would generally increase the calorific value of the information apparatus, the apparatus or its electronic components are required to efficiently radiate or cool the information apparatus as the information apparatus improves its functionality. The radiating heat sink becomes larger and heavier as the calorific value increases. It would become more important to consider the influence of radiations, vibrations and impacts by a holding fixture (or a retention mechanism) that holds the heat sink, and a reinforcing plate used to attach the holding fixture to a circuit board.

The electronic apparatus generally has an electronic circuit board mounted with plural electronic components. A semiconductor device, such as a central processing unit ("CPU"), is often mounted on the electronic circuit board. FIG. 6 is a view for explaining a conventional retention structure for a heat sink (not shown) that radiates the CPU 102 mounted on the electronic circuit board (or substrate) 101. A reinforcing plate 104 is attached on a bottom surface 101a of the substrate 101. The reinforcing plate 104 has a rectangular shape similar to a holding fixture 105, and arranges screw fixing studs 104a at four corners thereof.

The holding fixture 105 is attached on the top surface 101b at the opposite side to the reinforcing plate 104 so that the holding fixture 105 and the reinforcing plate 104 sandwich the substrate 101. The holding fixture 105 has a rectangular shape and a center hole 105a, which encloses the CPU 102 mounted on the substrate 101. The substrate 101 and the holding fixture 105 have four perforation holes 101c and 105b in place corresponding to the screw fixing studs 104a, and four screws 106 fasten the holding fixture 105, the substrate 101 and the reinforcing plate 104 to each other.

This attachment uses the reinforcing plate 104 to fix the holding fixture 105 upon the substrate 101 without fail. The holding fixture 105 has attachment holes 105c used to attach the heat sink. The heat sink contacts the CPU 102 and radiates the CPU 102 by inserting attachment fittings (not shown) into these attachment holes 105c. The attachment structure of such a holding fixture is disclosed in Japanese Utility-Model No. 3,083,951.

However, this structure results in the increased number of components and increased cost. In addition, the increased number of assembly steps spends lots of time and causes assembly task errors. If the reinforcing plate 104 is omitted in order to reduce the number of components, the holding fixture 105 should be fixed directly onto the substrate 101. The heat sink should be made heavier so as to improve the radiation efficiency. Due to the larger contact force to the CPU 102, the direct fixation of the holding fixture 105 onto the substrate may possibly damage the substrate 101.

BRIEF SUMMARY OF THE INVENTION

Accordingly, it is an exemplary object to provide a holding fixture that holds a large and heavy component while reducing the number of components and the number of assembly steps. Another and more specific object of the present invention is to provide a holding fixture that radiates or cools an electronic component, such as a CPU, with high efficiency (or that is applicable to a large heat sink) while reducing the number of components and the number of assembly steps.

A holding fixture according to one aspect of the present invention that holds a component and mounts the component onto an electronic circuit board includes a holding member that holds the component at a side of a first surface of the electronic circuit board, a first fixing member that includes a first base that is engageable with the holding member, and an elastic member that is pivotally attached to the base, holds the electronic circuit board at a side of a second surface of the electronic circuit board, and elastically supports the holding member at the side of the first surface, the second surface opposing to the first surface, and a second fixing member that includes a second base that is engageable with the holding member, and a projection member that projects from the second surface of the electronic circuit board and is engageable with the elastic member.

According to this structure, the holding fixture can be easily attached to the electronic circuit board, as the holding member and the elastic member sandwich the electronic circuit board. Since this structure does not have a fastening structure that uses screws, etc. to fasten the holding fixture onto the electronic circuit board, the electronic circuit board does not get damaged, because no excessive stress applies to the electronic circuit board even when the component is heavy. Since the first fixing member pivotally supports the elastic member around the first base and the elastic member serves as the reinforcing plate, the inventive structure uses the smaller number of parts than the conventional. The assembly efficiency improves since the assembly is completed only when the elastic member is engaged with the second fixing member.

The second fixing member may be integrated with the holding member. Then, the assembly efficiency improves with the smaller number of parts, because it is unnecessary to engage the second fixing member. Of course, the second fixing member can be engaged with the holding member independently. This structure improves the exchange efficiency because when the second fixing member gets damaged, only the second fixing member is replaced.

The elastic member may be a flat spring. The flat spring enables the holding fixture to be attached using its elasticity, and serves as the reinforcing plate using its rigidity.

The he elastic member may have an engagement hole through which the elastic member is engageable with the projection member, and an outer size of the projection member at a portion to be engaged with the engagement hole may be variable from a minimum diameter smaller than a hole diameter of the engagement hole to a maximum diameter larger than the hole diameter of the engagement hole. This structure facilitates an attachment of the holding fixture to and a detachment of the holding fixture from the electronic circuit board, convenient for the maintenance and exchange of the broken part.

A component mounting method according to another aspect of the present invention that holds a component and mounts the component onto an electronic circuit board includes the steps of engaging a first fixing member with a holding member that holds the component, the first fixing member including a first base and an elastic member that is pivotally attached to the base, engaging a second fixing member with the holding member, the second fixing member including a second base and a projection member that projects from the second surface of the electronic circuit board, engaging, after the holding member is arranged at a side of a first surface of the electronic circuit board, the elastic member with the projection member at a side of a second surface opposing to the first surface, and holding the component using the holding member.

According to this structure, the holding fixture can be easily attached to the electronic circuit board, as the holding member and the elastic member sandwich the electronic circuit board. Since this structure does not have a fastening structure that uses screws, etc. to fasten the holding fixture onto the electronic circuit board, the electronic circuit board does not get damaged, because no excessive stress applies to the electronic circuit board even when the component is heavy. Since the first fixing member pivotally supports the elastic member around the first base and the elastic member serves as the reinforcing plate, the inventive structure uses the smaller number of parts than the conventional. The assembly efficiency improves since the assembly is completed only when the elastic member is engaged with the second fixing member.

An electronic circuit unit according to another aspect of the present invention includes a component, an electronic circuit board, and a holding fixture that holds the component and mounts the component onto the electronic circuit board, wherein the holding fixture includes a holding member that holds the component at a side of a first surface of the electronic circuit board, a first fixing member that includes a first base that is engageable with the holding member, and an elastic member that is pivotally attached to the base, holds the electronic circuit board at a side of a second surface of the electronic circuit board, and elastically supports the holding member at the side of the first surface, the second surface opposing to the first surface, and a second fixing member that includes a second base that is engageable with the holding member, and a projection member that projects from the second surface of the electronic circuit board and is engageable with the elastic member.

According to this structure, the holding fixture can be easily attached to the electronic circuit board, as the holding member and the elastic member sandwich the electronic circuit board. Since this structure does not have a fastening structure that uses screws, etc. to fasten the holding fixture onto the electronic circuit board, the electronic circuit board does not get damaged, because no excessive stress applies to the electronic circuit board even when the component is heavy. Since the first fixing member pivotally supports the elastic member around the first base and the elastic member serves as the reinforcing plate, the inventive structure uses the smaller number of parts than the conventional. The assembly efficiency and reliability of the electronic circuit unit improve since the assembly is completed only when the elastic member is engaged with the second fixing member.

The component may be a heat sink. As discussed above, according to this structure, the electronic circuit board does not get damaged and the elastic member serves as the reinforcing plate, enabling a larger and heavier component to be held than the conventional. Therefore, this holding fixture is suitable to hold such a component as a heat sink that become larger due to the improved radiation efficiency.

An electronic apparatus according to still another aspect of the present invention includes the above electronic circuit unit. The electronic apparatus may further include at least one storage, and at least one drive connected to the electronic circuit unit.

According to this structure, the holding fixture can be easily attached to the electronic circuit board, as the holding member and the elastic member sandwich the electronic circuit board. Since this structure does not have a fastening structure that uses screws, etc. to fasten the holding fixture onto the electronic circuit board, the electronic circuit board does not get damaged, because no excessive stress applies to the electronic circuit board even when the component is heavy. Since the first fixing member pivotally supports the elastic member around the first base and the elastic member serves as the reinforcing plate, the inventive structure uses the smaller number of parts than the conventional. The assembly efficiency and reliability of the electronic apparatus improve since the assembly is completed only when the elastic member is engaged with the second fixing member. Thus, the present invention can provide high-quality products inexpensively to consumers.

Other objects and further features of the present invention will become readily apparent from the following description of the preferred embodiments with reference to accompanying drawings.

DETAILED DESCRIPTION OF THE PREFERRED EMBODIMENTS

Figure 1:
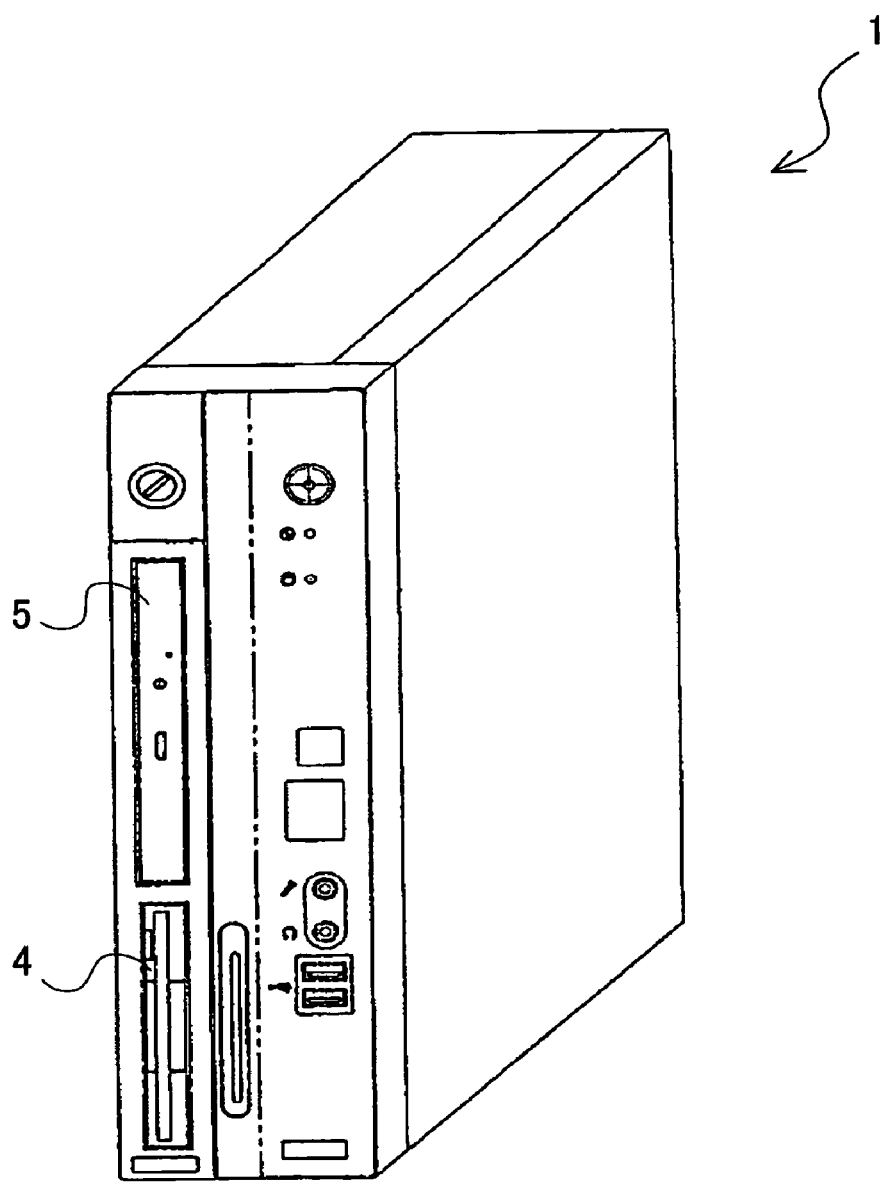
FIG. 1 is a perspective overview of a desktop personal computer according to one embodiment of the present invention.

A description will now be given of the embodiment of the present invention with reference to the accompanying drawings. FIG. 1 is a perspective overview of the desktop PC 1 as an electronic apparatus according to one embodiment of the present invention. The electronic apparatus is not limited to the desktop PC, but covers a laptop PC, a PDA, a personal game machine, various drives, and a word processor.

Figure 2:
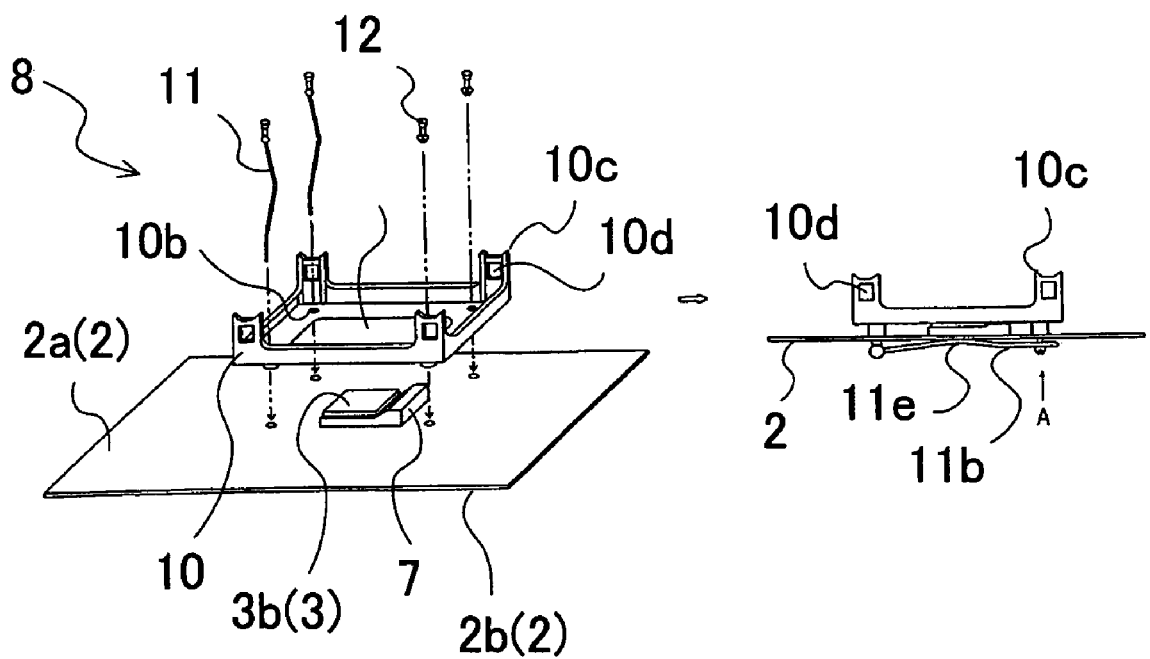
FIG. 2 is a perspective view of near a CPU on a motherboard in the desktop personal computer shown in FIG. 1.

The desktop PC 1 has a motherboard 2 inside (see FIG. 2). The motherboard 2 serves as a main board, and forms an electronic circuit unit that mounts many electronic components, such as a CPU 3, an external memory (or a storage) (not shown), a video memory (or a storage) (not shown), and a Universal Serial Bus ("USB") connector (not shown), on an electronic circuit board. The motherboard 2 has many interface connectors, thorough which the motherboard 2 is connected to various drives, such as a hard disc drive ("HDD") (not shown), a floppy® disk drive ("FDD") 4, and a CD-ROM drive 5, and various cards, such as a LAN card, a graphic card and a sound card.

Figure 3:
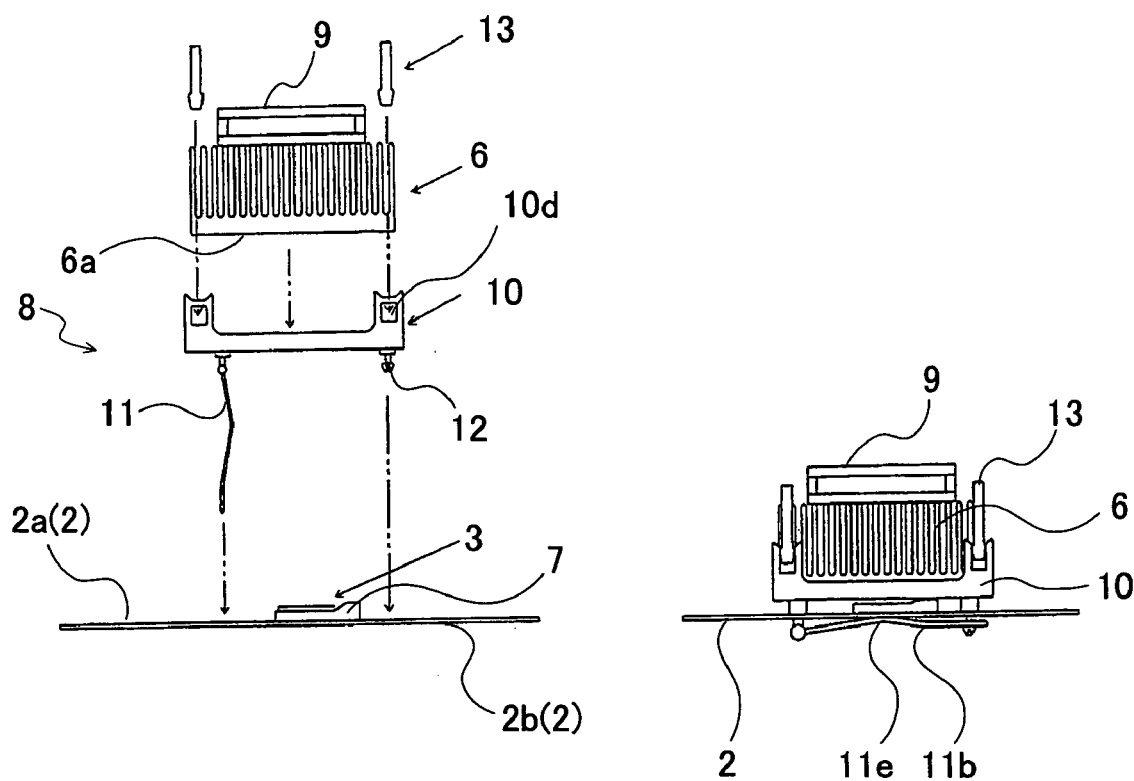
FIG. 3 is an exploded view showing an attachment of a heat sink to the CPU shown in FIG. 2.

FIG. 2 is a perspective view near the CPU 3 on the motherboard 2. FIG. 3 is an exploded view showing an attachment of a heat sink 6 that radiates the CPU 3 to a top of the CPU 3. The CPU 3 has a flat square shape, as illustrated. Many pins are formed on a CPU 3's mounting surface opposing to the motherboard 2, and soldered to the through holes formed in the motherboard 2. Thereby, the CPU 3 is mounted on the mounting surface 2a of the motherboard 2. Alternatively, a dedicated retainer 7 used to mount the CPU 3 mounts the CPU 3 on the motherboard 2 as illustrated. Since the mounting structure of the CPU 3 is well-known, a detailed description thereof will be omitted. While the motherboard 2 can be mounted with electronic components at its both surfaces, this embodiment conveniently refers to a surface mounted with the CPU 3 as the mounting (or first) surface 2a, and a surface opposing the mounting surface 2a as a rear (or second) surface 2b.

Figure 4:
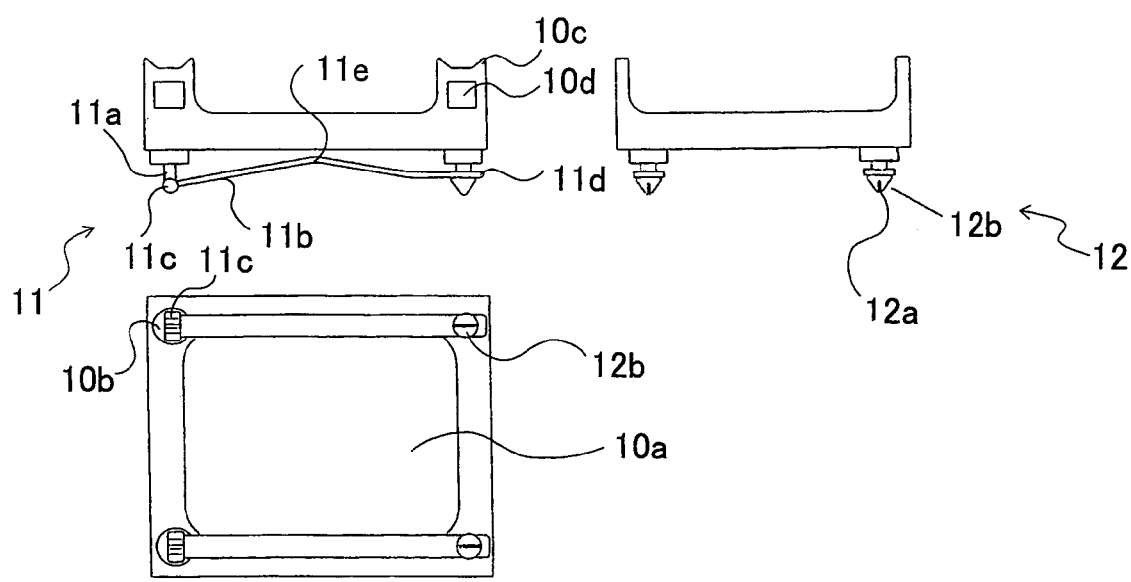
FIG. 4 shows longitudinal side, lateral side and plane views of a schematic structure of a retention mechanism shown in FIGS. 2 and 3.

A retention mechanism (or a holding fixture) 8 is attached to the mounting surface 2a of the motherboard 2, and encloses the CPU 3 mounted on the motherboard 2. FIG. 4 shows longitudinal and lateral side views and a plane view of a schematic structure of the retention mechanism 8. This retention mechanism 8 is used to mount the heat sink 6 onto the motherboard 2. The heat sink 6 radiates the CPU 3 when a bottom surface 6a contact a rear surface 3b of the CPU 3 opposing to the mounting surface. The heat sink 6 is a metal block that is made, for example, aluminum having high thermal conductivity and has many fins. A cooling fan 9 may be integrated to improve the radiation efficiency. Of course, a Peltier element (not shown) that provides a Peltier effect may be used for the heat sink 6.

The retention mechanism 8 includes a holding member 10, flat spring members (or first fixing members) 11, and pins (or second fixing members) 12. The holding member 10 is a housing for holding the heat sink 6, and is made of metal, such as aluminum and iron, or thermoset. As shown in FIGS. 2 and 3, an approximately square center hole 10a is formed around the CPU 3 so that the CPU 3 perforates through the hole 10a. Four attachment holes 10b are arranged around the hole 10a and used to attach the two flat spring members 11 and two pins 12, as described later. Perpendicular portions 10c are formed at four corners of the holding member 10, and each perpendicular portion 10c has an engagement hole 10d that is engageable with a fitting 13 used to fix the heat sink 6.

The flat spring member 11 is used to support the holding member 10 on the mounting surface 2a of the motherboard 2. The flat spring member 11 includes a base 11a and a bending flat spring 11b that is pivotally provided to the base 11a at a pivot portion 11c (see FIG. 4). After the holding member 10 is mounted on the mounting surface 2a at a predetermined position, the flat spring 11b is inserted into the attachment hole 10b and the corresponding attachment hole 2c formed in the motherboard 2 so that the flat spring 11b perforates these holes. The attachment hole 10b is so dimensioned that it allows the flat spring 11b and the pivot portion 11c to perforate through it but does not allow at least part of the base 11a to perforate through it. Therefore, the flat spring member 11 is engaged with the holding member 10 at the base 11a. When the flat spring 11b is rotated and its top 11d is engaged with the pin 12, which will be described later, the bending point 11e of the flat spring 11b contacts the rear surface 2b of the motherboard 2. This flat spring member 11 supports the holding member 10 elastically or its own elasticity so that the holding member 10 and the flat spring member 11 sandwich the motherboard 2.

The pin 12 is engaged with the top 11d of the flat spring member 11 at the rear surface 2b side of the motherboard 2, and supports the holding member 10 at the side of the mounting surface 2a side of the motherboard 2 in cooperation with the flat spring member 11. The pin 12 has a projection member 12b that has an approximately conical slitting 12a at its top, and a base 12c is engaged with the attachment hole 11b.

Figure 5:
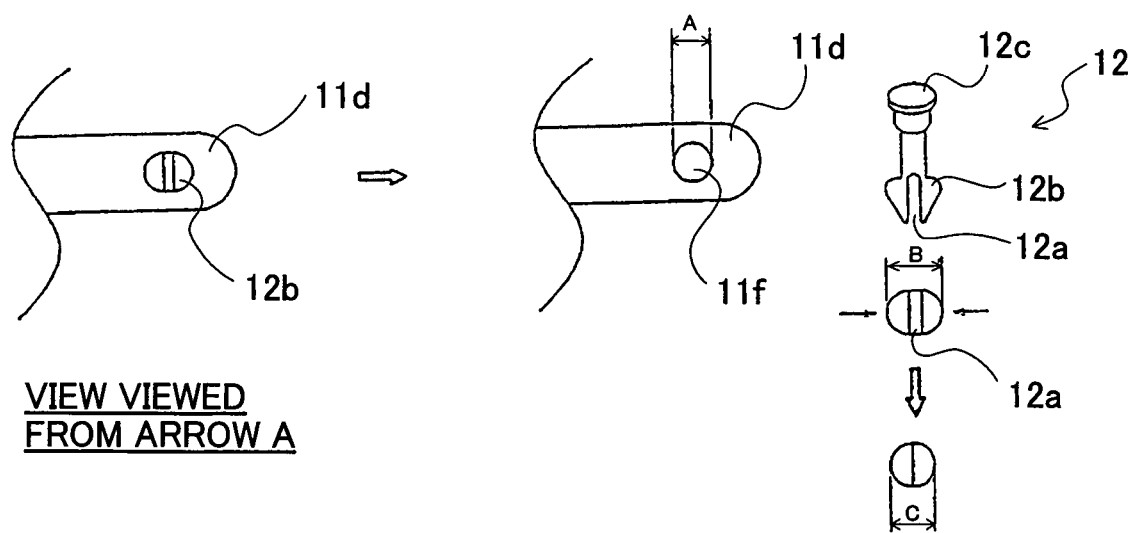
FIG. 5 is a view for explaining an engagement between a projection member and an engagement hole formed at the top of a flat spring in the retention mechanism shown in FIG. 4.
Figure 6:
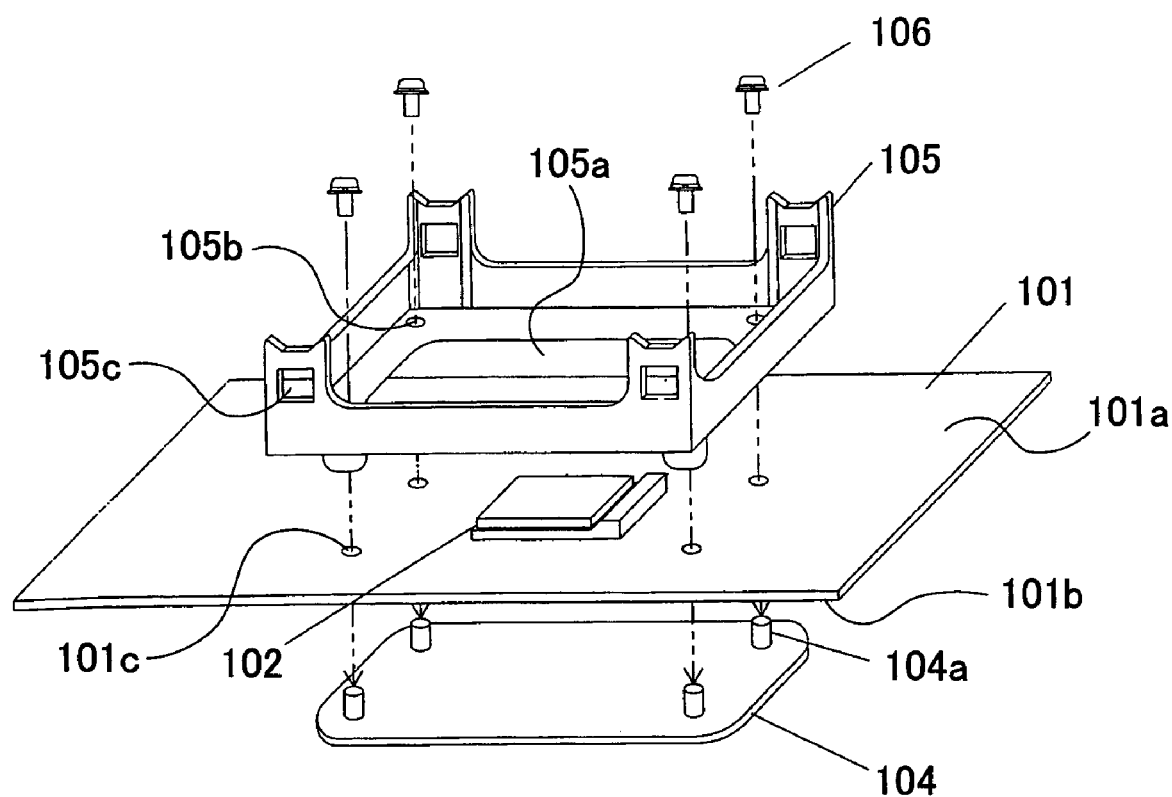
FIG. 6 is a view for explaining a conventional retention structure for a heat sink that radiates the CPU mounted on an electronic circuit board.

After the holding member 10 is mounted on the mounting surface 2a at a predetermined position, the pin 12 is inserted from the projection member 12b into the attachment hole 10b and the corresponding attachment hole 2c formed in the motherboard 2 so that the pin 12 perforates these holes. The top 11d of the flat spring 11b is engaged with the projection member 12b of the pin 12. Here, as shown in FIG. 5, a relationship B>A>C is met, where A is a diameter of the engagement hole 1 if formed in the top 11d of the flat spring 11b, B is a maximum outer diameter of the projection member 12b at the unloaded state, and C is a outer diameter of the projection member 12b that narrows the slitting 12a under the load. Thereby, as the projection member 12b is inserted into the engagement hole 11f, the projection member 12b deforms under the load, the slitting 12a is narrowed, and the projection member 12b can perforate through the engagement hole 11f. Once the projection member 12b perforates, the load is released and the maximum outer diameter of the projection member 12b (or a major axis size of the ellipse) becomes larger than a diameter of the engagement hole 11f, and the flat spring 11b cannot be pulled out of the pin 12. Thus, the flat spring 11b can be easily engaged with the pin 12 without fail by merely squeezing the flat spring 11b.

After the retention mechanism 8 is attached to the motherboard 2, the top of the fitting 13 is engaged with the engagement hole 10d in the perpendicular portion 10c and the fitting 13 holds the heat sink 6 on the retention mechanism 8. As the bottom surface 6a of the heat sink 6 contacts the rear surface 3b of the CPU 3, the CPU 3 can be efficiently radiated.

In detaching the flat spring 11b from the pin 12, the load is applied to the projection member 12b so as to deform the projection member 12b and narrow the slitting 12a. Then, the outer diameter of the projection member 12b becomes smaller than the bore of the engagement hole 11f, and the flat spring 11b can be easily detached from the pin 12. Thereby, the retention mechanism 8 can be easily detached from the motherboard 2.

Further, the present invention is not limited to these preferred embodiments, and various variations and modifications may be made without departing from the scope of the present invention. For example, the flat spring 11b can be replaced with another elastic member, such as a torsion spring, rubber and plastic, as long as the elastic member serves to support the holding member 10 on the motherboard 2 elastically. Each member or portion is not limited to a shape disclosed in this embodiment. For example, the engagement hole 11f does not have to have a circular shape, and the projection member 12b does not have to have a conical shape, if the projection member 12b at the unloaded state cannot pass the engagement hole 11f and the projection member 12b deformed by the load can pass the engagement hole 11f. l While the instant embodiment uses the slitting 12a for easy deformations, other deformable shapes, such as a notch and a cutout, can be used. If the projection member 12b itself deforms materially, no mechanical deforming structure is necessary.

Thus, the present invention easily attaches the holding fixture to the electronic circuit board. Even if the component is heavy, it does not apply an excessive stress to the electronic circuit board and the electronic circuit board does not get damaged. The number of parts is reduced because the elastic member serves as a reinforcing plate and supersedes fastening members, such as a screw. The present invention improves the assembly workability and reliability of the electronic circuit board, the reliability and part exchangeability of the electronic apparatus having the electronic circuit board, providing high-quality products inexpensively to consumers.

What is claimed is:

1. A holding fixture that holds a component and mounts the component onto an electronic circuit board, said holding fixture comprising:
   a holding member that releasably holds the component at a side of a first surface of the electronic circuit board;
   a first fixing member that includes a base that is engageable with said holding member, and an elastic member that is pivotally attached to the base; and
   a second fixing member that includes a projection member that projects from a second surface of the electronic circuit board and is engageable with the elastic member,
   wherein both the base and the elastic member can perforate through the electronic circuit board from a first surface of the electronic circuit board to a second surface opposite to the first surface.

2. A holding fixture according to claim 1, wherein said second fixing member is integrated with said holding member.

3. A holding fixture according to claim 1, wherein said elastic member is a flat spring.

4. A holding fixture according to claim 1, wherein said elastic member has an engagement hole through which said elastic member is engageable with the projection member, and an outer size of the projection member at a portion to be engaged with the engagement hole is variable from a minimum diameter smaller than a hole diameter of the engagement hole to a maximum diameter larger than the hole diameter of the engagement hole.

5. A component mounting method that holds a component and mounts the component onto an electronic circuit board, said method comprising the steps of:
   engaging a first fixing member with a holding member that holds the component, the first fixing member including a base and an elastic member that is pivotally attached to the base;
   engaging a second fixing member with the holding member, the second fixing member including a projection member that projects from the second surface of the electronic circuit board;
   arranging the holding member at a side of a first surface of the electronic circuit board so that both the base and the elastic member can perforate through the electronic circuit board from a first surface of the electronic circuit board to a second surface opposite to the first surface;
   engaging said elastic member with said projection member at a side of a second surface; and
   releasably holding the component using the holding member.

6. An electronic circuit unit comprising:
   a component;
   an electronic circuit board; and
   a holding fixture that holds the component and mounts the component onto the electronic circuit board,
   wherein said holding fixture includes:
   a first fixing member that includes a base that is engageable with an elastic member, the elastic member being pivotally attached to the base; and
   a second fixing member that includes a projection member that projects from a second surface of the electronic circuit board and is engageable with the elastic member,
   wherein both the base and the elastic member can perforate through the electronic circuit board from the first surface of the electronic circuit board to the second surface opposite to the first surface.

7. An electronic circuit unit according to claim 6, wherein said component is a heat sink.

8. An electronic apparatus comprising an electronic circuit unit according to claim 6.

9. An electronic apparatus according to claim 8, further comprising:
   at least one storage; and
   at least one drive connected to said electronic circuit unit.

* * * * *